United States Patent
Lee et al.

(10) Patent No.: US 6,670,219 B2
(45) Date of Patent: Dec. 30, 2003

(54) METHOD OF FABRICATING A CDBGA PACKAGE

(75) Inventors: Ming-Xun Lee, Taichung Hsien (TW); Chin-Te Chen, Taichung Hsien (TW)

(73) Assignee: Siliconware Precision Industries Co., Ltd., Taichung Hsien (TW)

( * ) Notice: Subject to any disclaimer, the term of this patent is extended or adjusted under 35 U.S.C. 154(b) by 0 days.

(21) Appl. No.: 10/310,588

(22) Filed: Dec. 4, 2002

(65) Prior Publication Data

US 2003/0080423 A1 May 1, 2003

Related U.S. Application Data

(62) Division of application No. 09/955,849, filed on Sep. 18, 2001, now Pat. No. 6,515,361.

(30) Foreign Application Priority Data

Jan. 20, 2001 (TW) .......................................... 90101425 A

(51) Int. Cl.$^7$ .............................................. H01L 21/44
(52) U.S. Cl. .................... 438/107; 438/106; 438/107; 438/111; 257/678; 257/734; 257/778
(58) Field of Search .................................. 438/106, 107, 438/111; 257/678, 734, 778, 712, 738, 684

(56) References Cited

U.S. PATENT DOCUMENTS 6,020,637 A * 2/2000 Karnezos ..................... 257/738

\* cited by examiner

Primary Examiner—Dung Anh Le
(74) Attorney, Agent, or Firm—J.C. Patents

(57) ABSTRACT

A CDBGA package comprises a thermal dissipating substrate and a plurality of conductive bumps. A plurality of vias are formed on a circuit substrate and correspond to the conductive bumps. A plurality of ground pads, ball pads and nodes are formed on the circuit substrate, wherein the ground pads are located in the vias. A solder mask layer covers the patterned trace layer. A plurality of bonding pads are formed on a chip and are electrically connected to the nodes. A molding compound encapsulates the chip, nodes and bonding pads. A plurality of solder balls are located on the ground pads and ball pads, wherein the solder balls fill the vias and are electrically connected to the conductive bumps.

13 Claims, 12 Drawing Sheets

METHOD OF FABRICATING A CDBGA PACKAGE

CROSS-REFERENCE TO RELATED APPLICATION

This application is a divisional application of, and claims the priority benefit of, U.S. application Ser. No. 09/955,849 filed on Sep. 18, 2001 now U.S. Pat. No. 6,515,361.

BACKGROUND OF THE INVENTION

1. Field of Invention

The present invention relates generally to a cavity down ball grid array package (CDBGA) and a fabrication method thereof More particularly, the present invention relates to an improved CDBGA package with high reliability.

2. Description of Related Art

With the increasing need for high-density devices for use in lightweight, portable electronics, there has been a gradual shift in the sizes of integrated circuits and their package configurations. This gradual shift has resulted in developing various techniques for different package types.

A ball grid array (BGA) package is a common packaging method in the field of electronic packages. The BGA package utilizes tape or other adhesive materials to adhere a back surface of a chip onto a die pad of a substrate. A plurality of bonding pads are electrically connected to a plurality of nodes of the substrate by conductive wires. A molding compound encapsulates the chip, conductive wires and nodes. A plurality of solder balls are formed on the nodes of the substrate. The above-mentioned structure of a BGA package can utilize solder balls to electrically connect to external circuits. The layout of the solder balls of the BGA package is in a matrix form and it is suitable for a high-density package because it can contain a large quantity of external circuits.

However, although the packaging size is reduced, the integration of the device is increased. Thus the heat produced per unit of area of the device increases Therefore a heat dissipation problem occurs. For a BGA package, a cavity down ball grid array (CDBAG) package has better heat dissipation because the back surface of the chip is in contact with a heat spreader, and heat is transferred through the heat spreader to the external environment. Thus, the structure of the CDBGA package is often utilized FIGS. 1–4 are schematic cross-sectional views of fabricating a CDBGA package in accordance with U.S. Pat. No. 6,020,617.

Referring to FIG. 1 and FIG. 1A, wherein the FIG. A depicts a top view of FIG. 1, shows a thermal dissipating substrate 110 comprising a heat spreader 130 and a ground plate 140. The ground plate 140 is adhered onto a surface 132 of the heat spreader 130 by an adhesive material 120. An opening 142 is formed in the ground plate 140. Thus, a cavity is formed in the center of the thermal dissipating substrate 110

A loop-shaped first node 146 and a plurality of second nodes 148 are selective plated on a surface 144 of the ground plate 140. The first node and the second nodes are made of materials selected from a group consisting of gold and silver. A black oxide treatment is carried out to roughen a surface 144 of the ground plate 140, so that the adhesion between the ground plate and the substrate (not shown) can be increased.

Referring to FIG. 2, a substrate 150 comprising an insulating layer 160 and a patterned trace layer 170. The insulating layer 160 of the substrate 150 is adhered onto the surface 144 of the ground plate 140 by an adhesive material 122. A plurality of ground pads 172, ball pads 174 and nodes 176 are formed on the patterned trace layer 170. The substrate 150 further comprises a solder mask layer 180 that protects the patterned trace layer 170 and exposes the ground pads 172, the ball pads 174 and nodes 176. A plurality of vias 190, which are formed on the substrate 150, are pierced through the patterned trace layer 170, insulating layer 160 and adhesive material 122, and the second nodes 148 are exposed.

A stencil printing method is utilized to fill a conductive material into the vias 190 in order to electrically connect the ground pads 172 to the second nodes 148.

Referring to FIG. 3, a chip 200 has an active surface 202 and a corresponding back surface 204, wherein a plurality of bonding pads 206 and ground bonding pads 208 are formed on the active surface 202. The back surface 204 of the chip 200 is adhered onto a surface 132 of the heat spreader 130 by an adhesive material 124. The bonding pads 206 are electrically connected to the node 176 by a plurality of conductive wires 210, and the ground bonding pads 208 are also electrically connected to the first nodes 146.

Referring to FIG. 4, a molding process is carried out to encapsulate the chip 200, the bonding pads 206, the ground bonding pads 208, the conductive wires 210, the first node 146 and the nodes 176 by a molding compound 220. A plurality of solder balls 230 are formed on the ground pads 172 and the ball pads 174.

However, in the above-mentioned fabrication process, the conductive material has to be filled into the vias by the stencil printing method This step of utilizing the stencil printing method is complex, and thus the cost is increased. On the other hand, voids often occur inside the conductive material in the vias during the stencil printing process because of poor gap-fill. Therefore, the reliability of the product is reduced

SUMMARY OF THE INVENTION

Accordingly, it is an object of the present invention to provide a CDBGA package and a fabrication method thereof, which can simplify the fabrication process and reduce the production cost.

It is another object of the present invention to provide a CDBGA package and a fabrication method thereof, which can ensure a good electrical connection of the conductive material in the vias, so that the reliability of the device can be improved.

To achieve the above objects and other advantages in accordance with the present invention, the present invention provides a CDBGA package comprising: a thermal dissipating substrate having a chip region located in the center and a circuit substrate region located at a periphery of the chip region; a plurality of conductive bumps formed on the circuit substrate region; a circuit substrate comprising an insulating layer and a patterned trace layer, wherein a plurality of vias are formed in the insulating layer and correspond to the conductive bumps, and the insulating layer is adhered on the circuit substrate region; a plurality of ground pads, ball pads and nodes are formed on the patterned trace layer, wherein the ground pads correspond to the vias, and a hole is formed at the center of each ground pad corresponds to each via; the circuit substrate further comprises a solder mask layer covering the patterned trace layer and exposing the ground pads, ball pads and the nodes; a chip having an active surface and a corresponding back surface, the back surface of the chip is adhered on the chip region, and a plurality of bonding pads are formed on the active surface, wherein the bonding pads are electrically connected to the nodes; a molding compound encapsulating the chip, the nodes and the connecting parts of the bonding pads and the nodes; and a plurality of solder balls located on the ground pads and the ball pads, wherein the solder balls located at the ground pads fill the vias and are electrically connected to the conductive bumps.

To achieve the foregoing and other objects and in accordance with the purpose of the present invention, the present invention provides a method of fabricating a CDBGA package, and the steps of the method comprise: providing a thermal dissipating substrate having a chip region in its center and a circuit substrate region located at a periphery of the chip region; forming a plurality of conductive bumps on the circuit substrate region; forming a circuit substrate, the circuit substrate comprising an insulating layer and a patterned trace layer, wherein a plurality of vias that are formed on the insulating layer correspond to the conductive bumps; adhering the insulating layer on the circuit substrate region; forming a plurality of ground pads, ball pads and nodes on the patterned trace layer, wherein the ground pads are located on the vias, and each ground pad has a hole located in its center and corresponding to each via; forming a solder mask to cover the patterned trace layer and to expose the ground pads, the balls pads and nodes; providing a chip having an active surface and a corresponding back surface, wherein the back surface of the chip is adhered on the chip region, and a plurality of bonding pads are formed on the active surface, electrically connecting the bonding pads to the nodes; performing a molding process, wherein a molding compound encapsulates the chip, the nodes and the connecting portions between the bonding pads and the nodes; placing a plurality of solder balls on the ground pads and the ball pads, wherein the solder balls locating on the ground pads fill the vias and are electrically connected to the conductive bumps.

According to one embodiment of the present invention, the thermal dissipating substrate further comprises a heat spreader and a ground plate, which is located at the circuit substrate and has a cavity exposing the chip region. The chip is electrically connected to the ground plate, and the chip is adhered on a bottom surface of the cavity that is formed in the thermal dissipating substrate.

The insulating layer is made of polyimide material, and the patterned trace layer is defined by etching a copper foil layer using photolithography. On the other hand, there are three fabrication methods of conductive bumps including wire bonding, electroplating and dispensing. The conductive bumps are made of a material selected from a group consisting of gold and silver. A palladium layer is electroplated on the surface of the circuit substrate region Both the foregoing general description and the following detailed description are exemplary and explanatory only and are not restrictive of the invention, as claimed.

BRIEF DESCRIPTION OF THE DRAWINGS

The accompanying drawings are included to provide a further understanding of the present invention, and are incorporated in and constitute a part of this specification The drawings illustrate embodiments of the invention and, together with the description, serve to explain the principles of the invention In the drawings.

DESCRIPTION OF THE PREFERRED EMBODIMENTS

FIGS. 5 to 9 illustrate schematic cross-sectional views of fabrication process steps of a CDBGA package in accordance with a first embodiment of the present invention. FIG. 5A is a schematic top view of FIG. 5.

Figure 1:
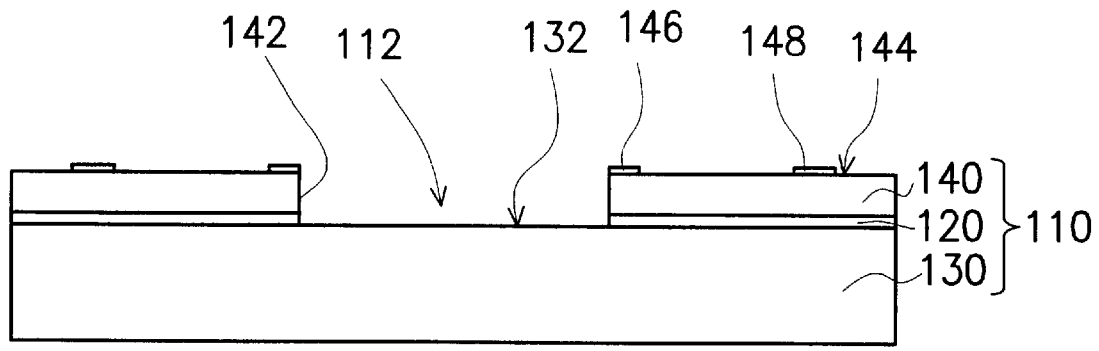
FIGS. 1–4 are schematic cross-sectional views of fabrication process steps of a CDBGA package in accordance with a conventional method.
Figure 1A:
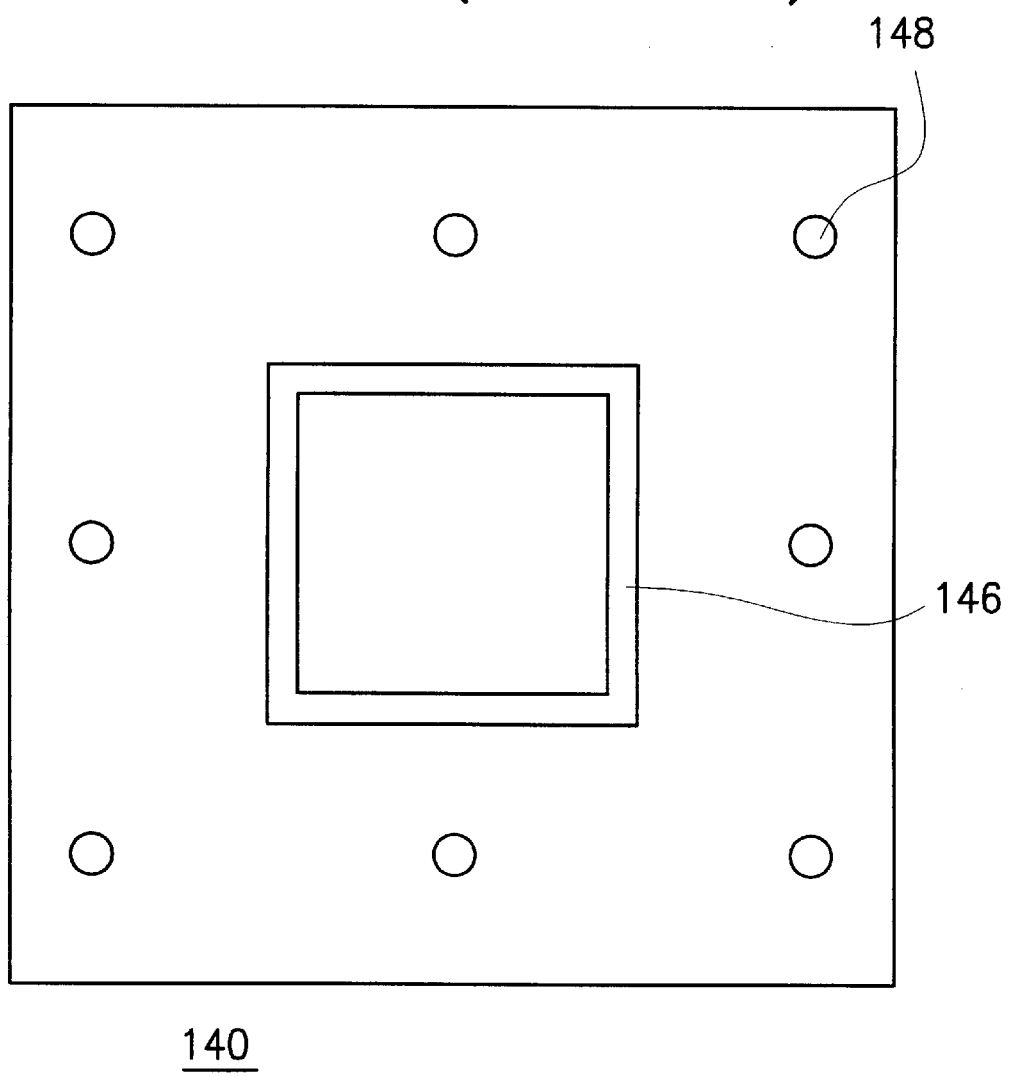
FIG. 1A is a top view of FIG. 1.
Figure 2:
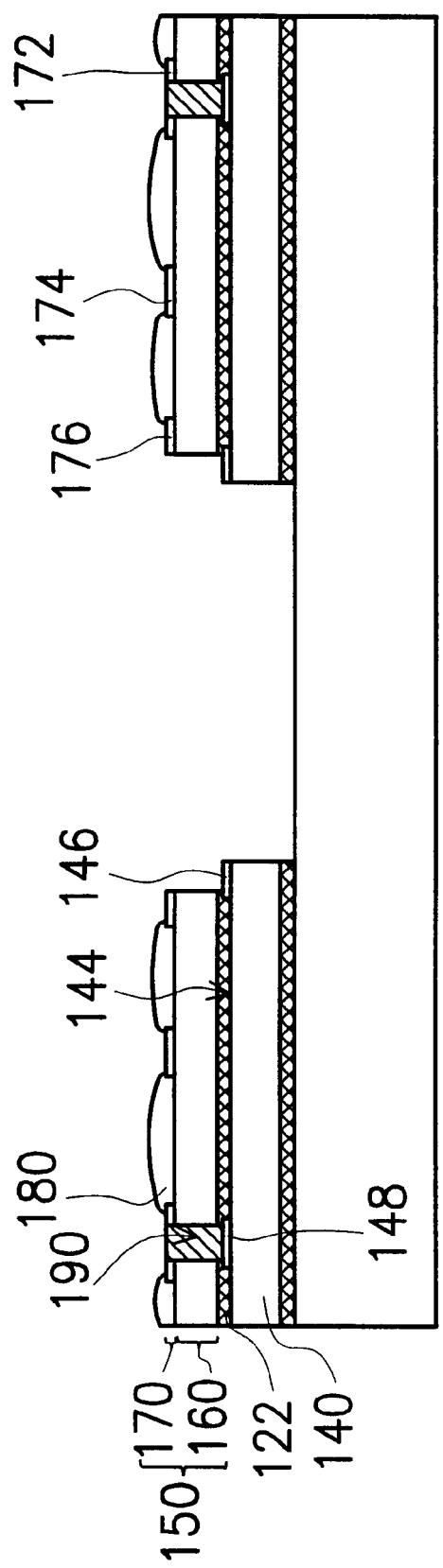
Figure 3:
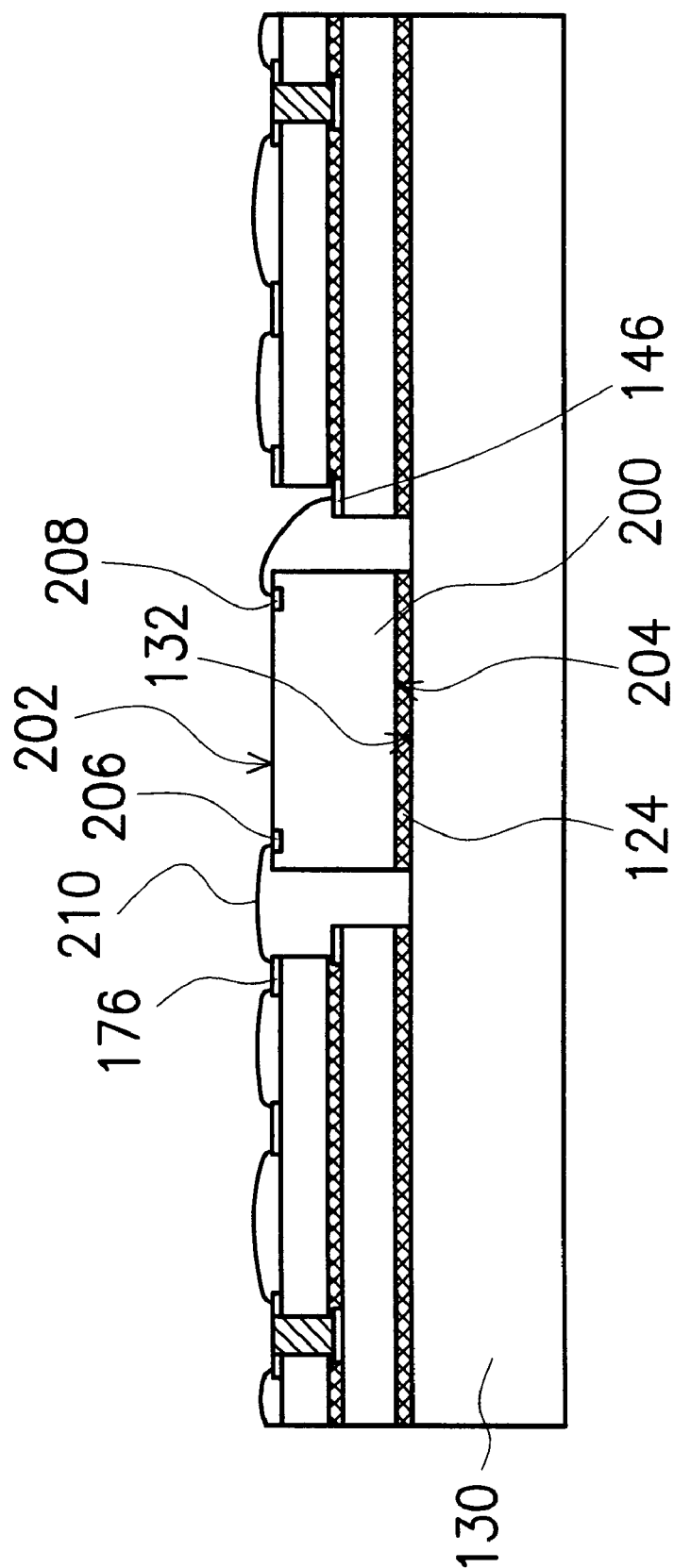
Figure 4:
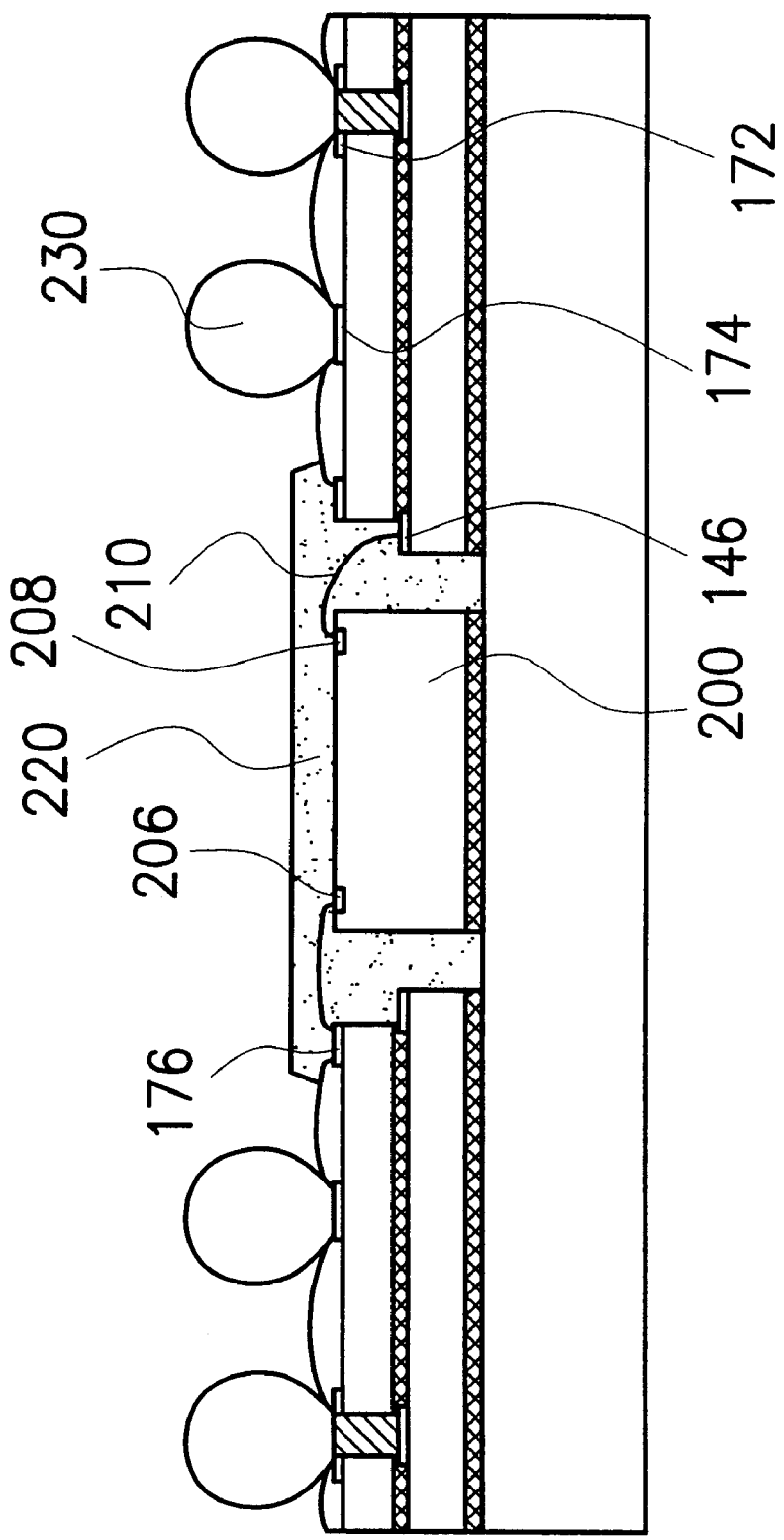
Figure 5:
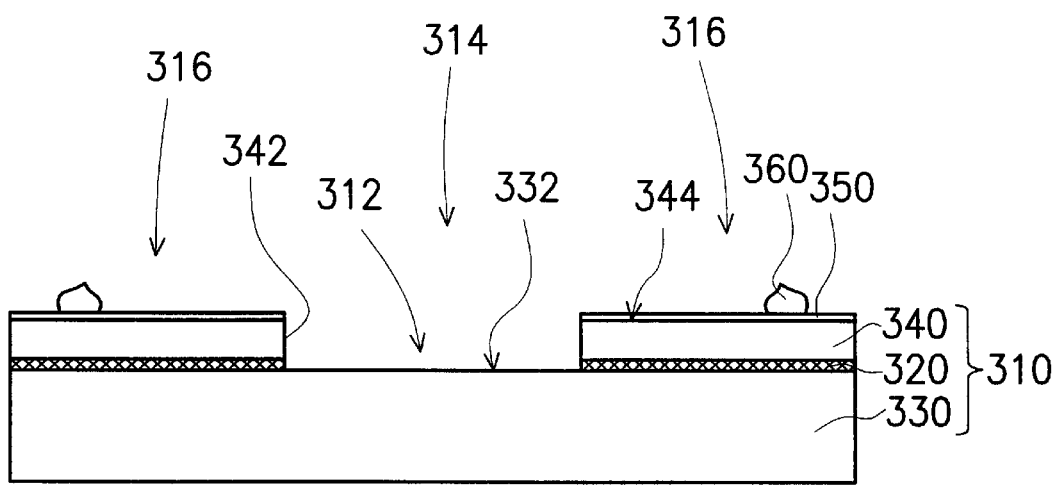
FIGS. 5–9 are schematic cross-sectional views of fabrication process steps of a CDBGA package in accordance with a first embodiment of the present invention
Figure 5A:
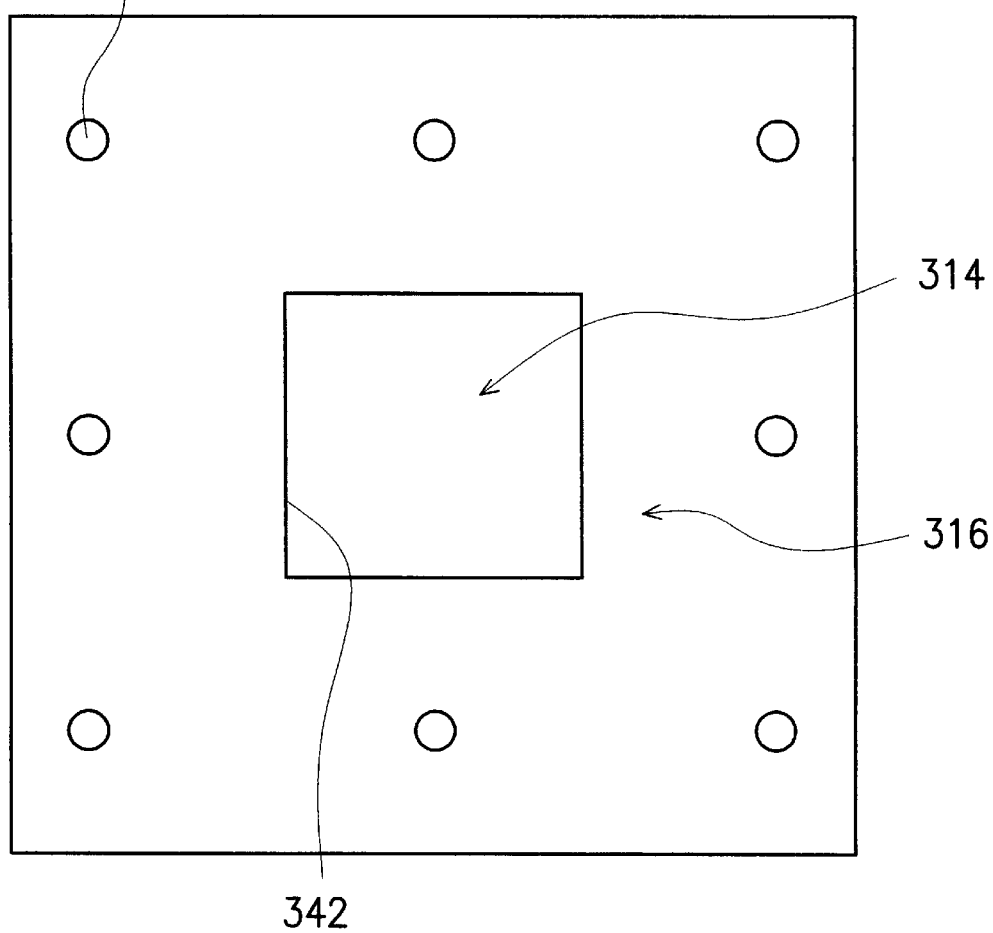
FIG. 5A is a schematic top view of FIG. 5.

Referring to FIG. 5, a thermal dissipating substrate 310 comprising a chip region 314 and a substrate location 316. A heat spreader 330 and a ground plate 340 are adhered by an adhesive material 320 to form the thermal dissipating substrate 310. The ground plate 340 is located on the surface 332 of the substrate location 316 of the heat spreader 330. An opening 342 is formed on the ground plate 340, and a cavity 312 is formed in a central portion of the thermal dissipating substrate 310. The location where the cavity 312 is formed is a chip region 314 for positioning a chip.

A surface treatment can be chosen to plate a layer of palladium 350 on the surface 344 of the ground plate 340. An electroplating process is carried out to form conductive bumps 360, which are formed on the palladium layer 350. There are three different fabrication methods of conductive bumps 360. A first method consists of utilizing a wire bonding process to form the conductive bumps 360 by a wire bonding machine. A second method utilizes an electroplating process to form the conductive bumps 360, using a material selected from a group consisting of gold or silver. The conductive bumps 360 can also be formed by a third method of dispensing.

The above-mentioned first embodiment, a wire bonding process is performed to fabricate the conductive bumps. However, the present invention is not limited to such application. In fact, various techniques can be utilized to fabricate the conductive bumps.

Figure 6:
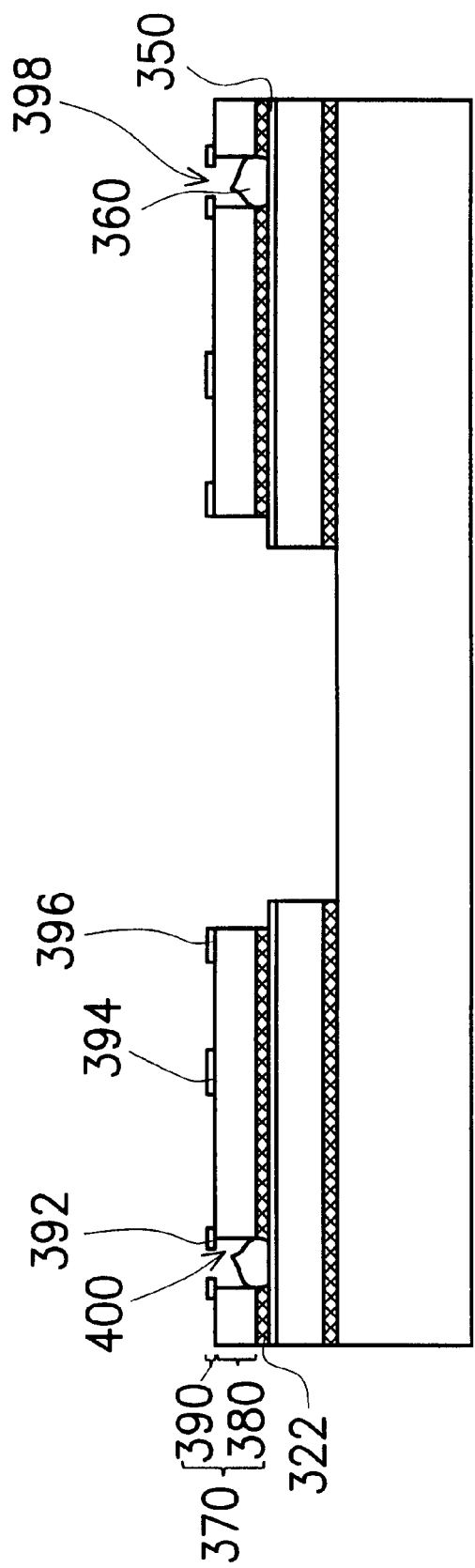

Referring to FIG. 6, a circuit substrate 370 comprising an insulating layer 380 and a patterned trace layer 390, wherein the circuit substrate 370 utilizes the insulating layer 380 to adhere onto the palladium layer 350 by an adhesive material 322. A plurality of ground pads 392, ball pads 394 and nodes 396 are formed on the patterned trace layer 390. A plurality of vias 400, which are formed on the insulating layer 380, correspond to conductive bumps 360. The ground pads 392 are located on the vias 400 Each ground pad 392, which has a hole 398, corresponds to the vias 400.

Figure 7:
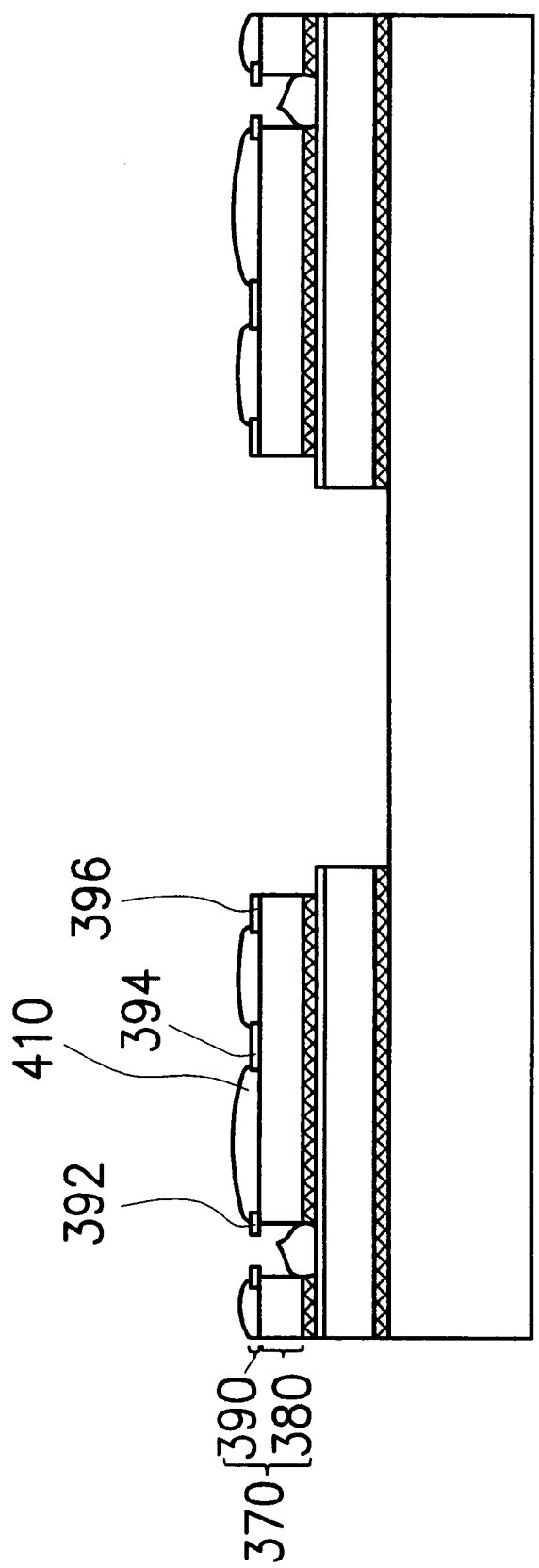

Referring to FIG. 7, a solder mask layer 410, which is formed on the circuit substrate 370, protects the patterned trace layer 390 and exposes the ground pads 392, ball pads 394 and nodes 396 On the other hand, the solder mask 410 can be coated on the circuit substrate 370 before adhering the circuit substrate 370 onto the palladium layer 350.

Figure 8:
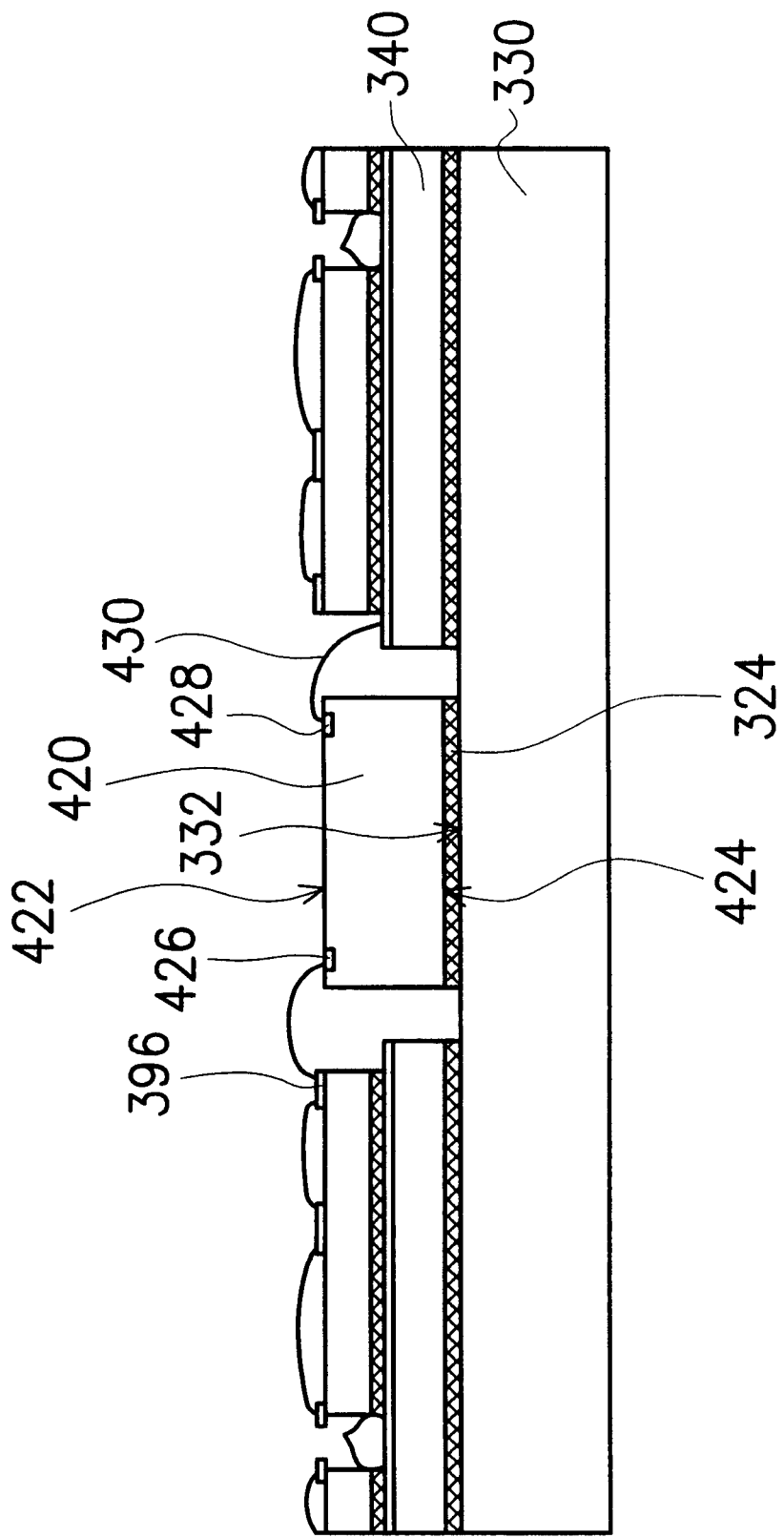

Referring to FIG. 8, a chip 420 comprises an active surface 422 and a corresponding back surface 424, wherein a plurality of bonding pads 426 and ground bonding pads 428 are formed on the active surface 422. The back surface 424 of the chip 420 is adhered onto the surface 332 of the chip region 314 of the heat spreader 330 by an adhesive material 324 A wire bonding process is carried out to electrically connect the bonding pads 426 to the nodes 396 and the ground bonding pads 428 to the ground plates 340 by a plurality of conductive wires 430.

Figure 9:
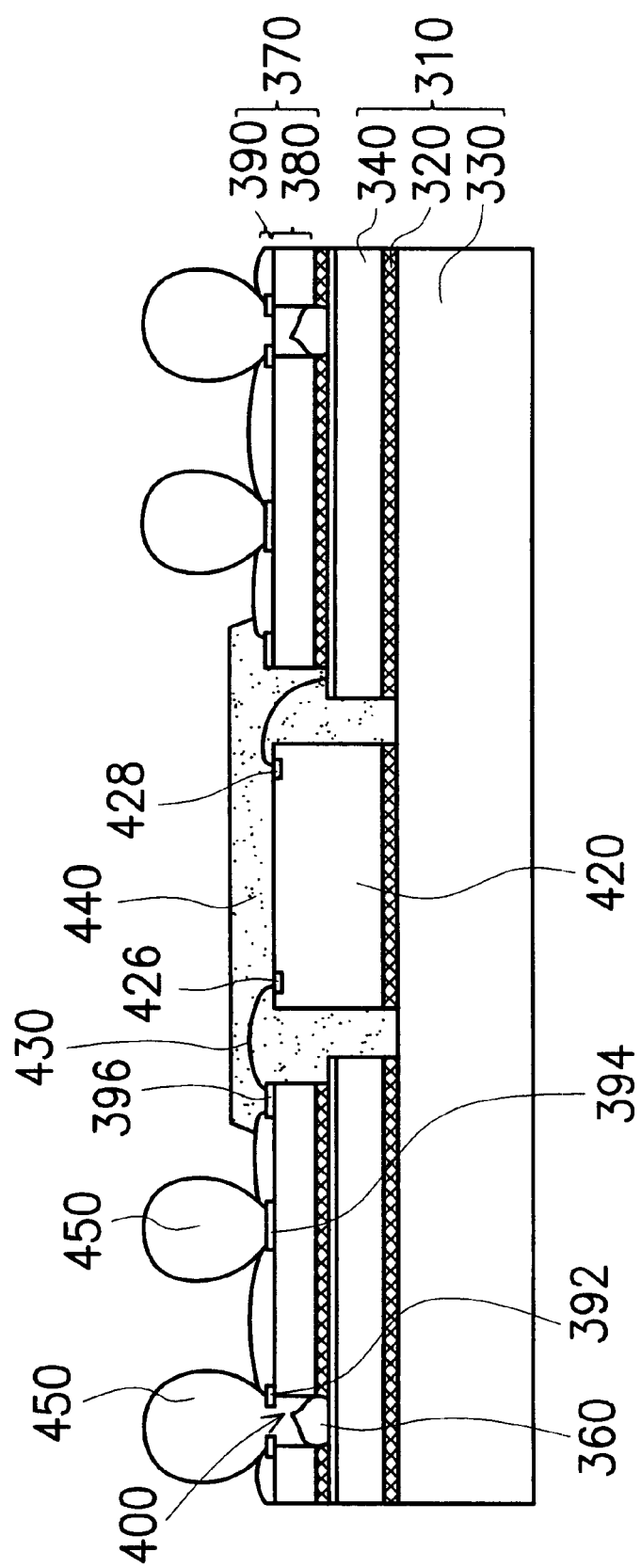

Referring to FIG. 9, a molding process is performed to encapsulate the chip 420, bonding pads 426, ground bonding pads 428, conductive wires 430 and nodes 396 by utilizing a molding compound 440. A ball placing process is performed and through a reflow process a plurality of solder balls 450 are formed in which the solder balls 450 are bonded respectively to the ground pads 392 and ball pads 394. The conductive material of the solder balls 450 located on the ground pads 392 is filled into the vias 400 and is electrically connected to the conductive bumps 360.

In the above-described fabrication process, as shown in FIG. 6, the circuit substrate 370 is adhered onto the thermal dissipating substrate 310 and the conductive bumps 360 partially fill the corresponding vias 400 of the circuit substrate 370. Through the ball placing process and the reflow process, the conductive material of the solder balls 450 is filled in the vias 400. Thus the fabrication process is simplified and the cost is reduced. As a matter of fact, voids are not easily formed in the vias 400. Therefore, a good electrical connection in the vias can be maintained, and the reliability of the product thus is improved.

Figure 10:
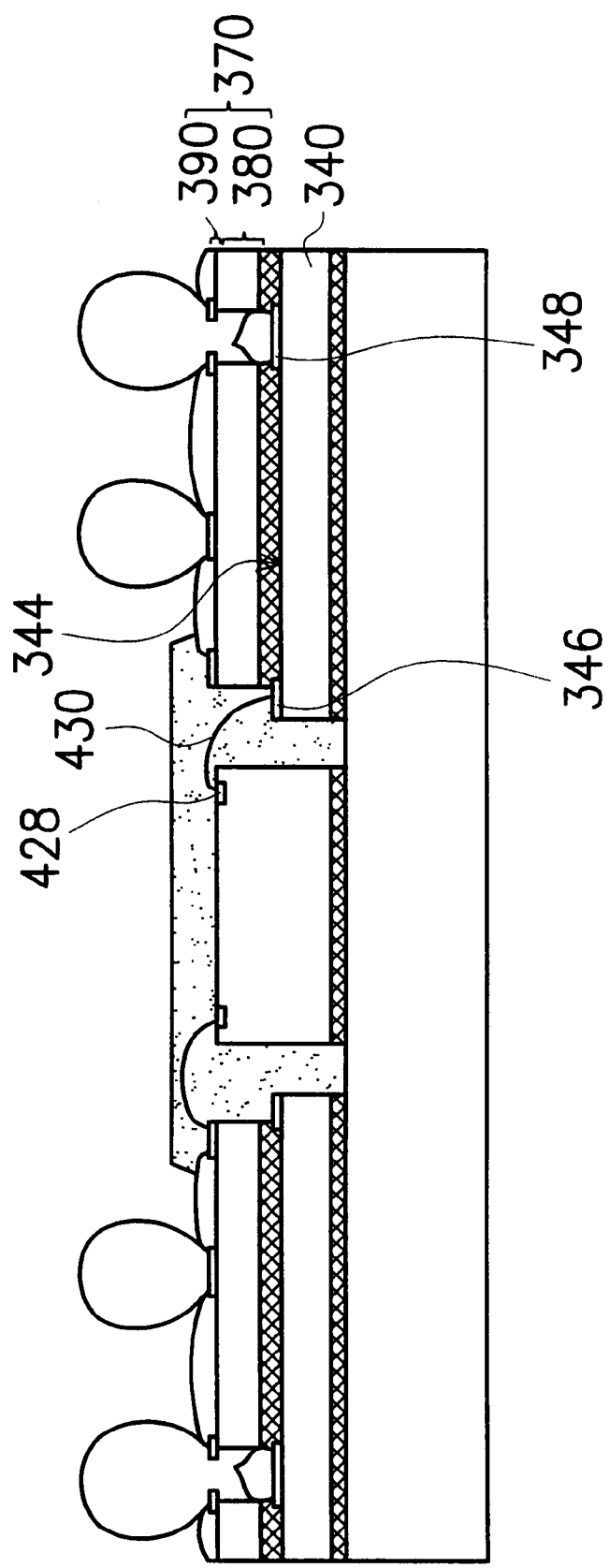
FIG. 10 is a schematic cross-sectional view of a CDBGA package in accordance with a second embodiment of the present invention.

FIG. 10 illustrates a cross-sectional view of a CDBGA package in accordance with a second embodiment of the present invention. From the above-mentioned first embodiment, during the step of the surface treatment, the palladium layer is formed on the surface of the ground plate. Then, conductive bumps are formed on the palladium layer. However, the electroplating process and the materials utilized are not to limited to the above-mentioned method. A plurality of first nodes 346 and second nodes 348 can be selectively plated on the surface 344 of the ground plate 340, wherein the first nodes 346 and the second nodes 348 arc made of conductive materials comprising gold and silver. A black oxide treatment is carried out to roughen the surface 344 of the ground plate 340 in order to increase the adhesion between the surface 344 of the ground plate 340 and the insulating layer 380 of the circuit substrate 370. The conductive bumps 360 are located on the second nodes 348, and the ground bonding pads 428 are electrically connected to the first nodes 346 by conductive wires 430.

Figure 11:
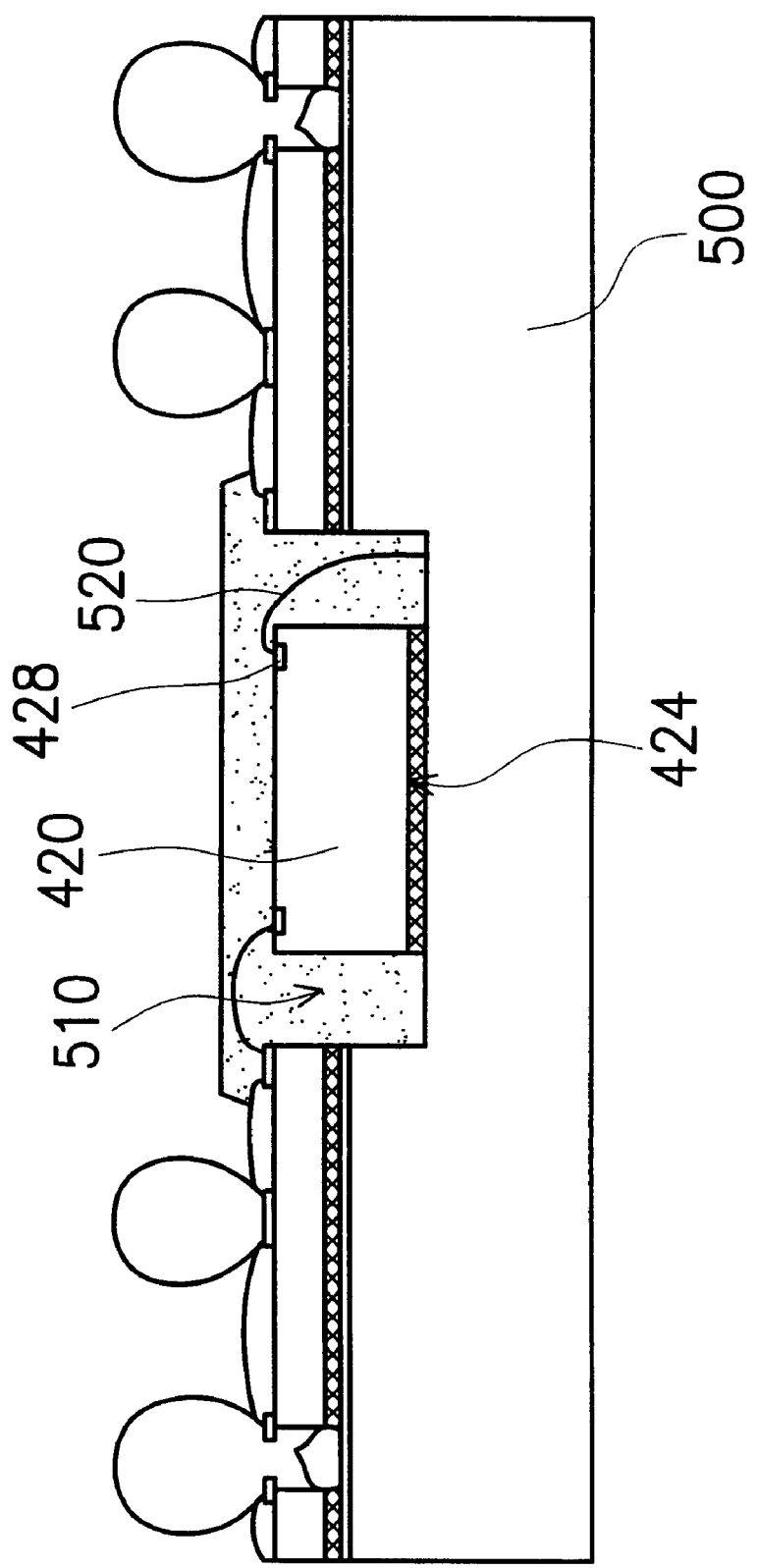
FIG. 11 is a schematic cross-sectional view of a CDBGA package in accordance with a third embodiment of the present invention.

FIG. 11 illustrates a cross-sectional view of a CDBGA package in accordance with a third preferred embodiment of the present invention. According to the first embodiment, the ground plate in the thermal dissipating substrate is adhered onto the heat spreader by an adhesive material. However, the structure of the formation of the thermal dissipating substrate is not limited to the above-described first embodiment. From FIG. 11, an integrated structure of a thermal dissipating substrate 500 that has a cavity 510 located in the central region for a chip 420 can be utilized. The circuit substrate is adhered directly onto the thermal dissipating substrate 500, and a back surface 424 of the chip 420 is adhered onto a bottom surface of the cavity 510. A plurality of conductive wires 520 electrically connect a plurality of ground bonding pads 428 to the thermal dissipating substrate 500.

Figure 12:
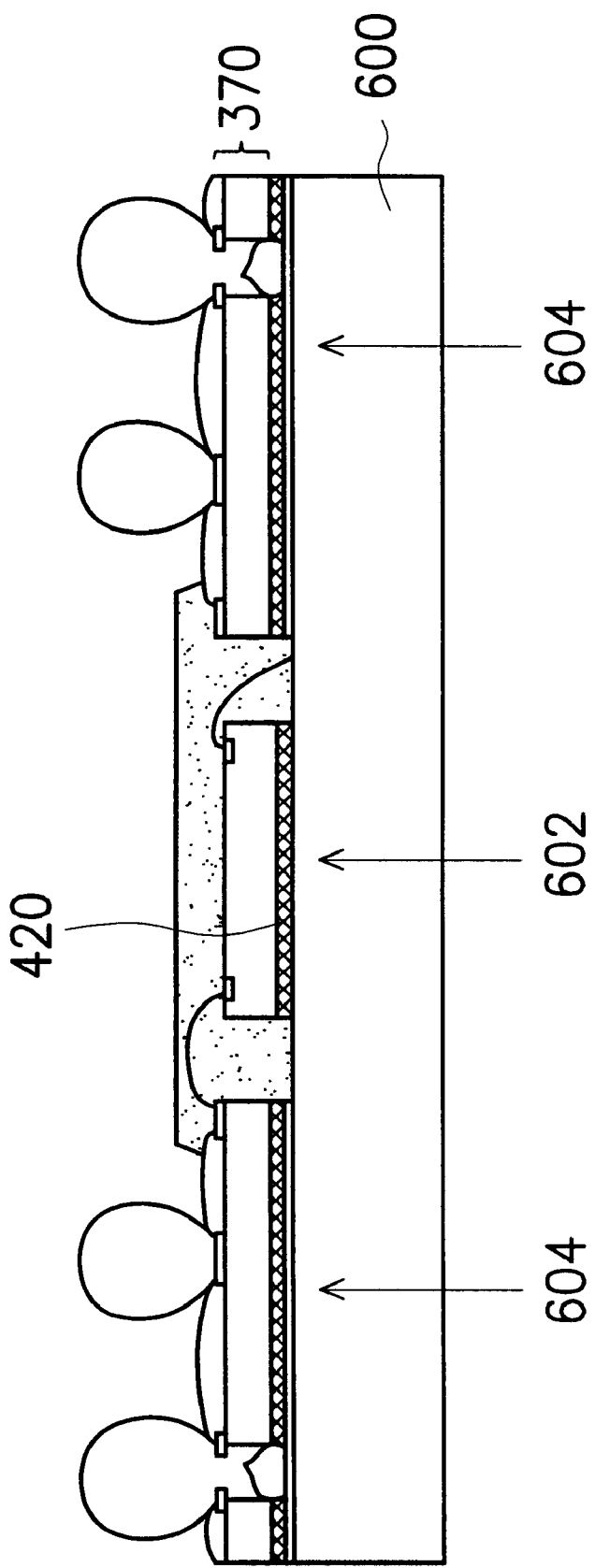
FIG. 12 is a schematic cross-sectional view of a CDBGA package in accordance with a fourth embodiment of the present invention.

FIG. 12 illustrates a cross-sectional view of a CDBGA package in accordance with a fourth embodiment of the present invention. According to the third embodiment, the cavity is formed on the thermal dissipating substrate. However, the structure of the thermal dissipating substrate 600 is not limited to the above-described embodiment. Referring to FIG. 12, a thermal dissipating substrate 600 without a cavity can be utilized A chip 420 is adhered on a region 602 for locating the chip, and a circuit substrate 370 is adhered on a region 604 for locating the circuit substrate 370. An opening, which is formed in the circuit substrate 370, is also located on the surface of the thermal dissipating substrate 600.

From the above-described embodiments, with the fabrication of conductive bumps, when the circuit substrate is adhered onto the thermal dissipating substrate, the conductive bumps will fill the corresponding vias in the circuit substrate Through the ball placing process and the reflow process, the conductive material fills the vias. Thus the whole fabrication process is simplified and the cost is reduced. As a matter of fact, voids cannot be formed easily in the vias. Therefore, a good electrical connection in the vias can be maintained, and the reliability of the product thus is improved.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a CDBGA package, comprising:

providing a thermal dissipating substrate having a chip region at the center thereof and a circuit substrate region located at a periphery of the chip region;

forming a plurality of conductive bumps on the circuit substrate region;

providing a circuit substrate comprising an insulating layer and a patterned trace layer, wherein a plurality of vias are formed on the insulating layer, and the conductive bumps partially fill the vias, wherein the insulating layer is adhered on the circuit substrate region, and a plurality of ground pads, ball pads and nodes are formed on the patterned trace layer, and wherein the ground pads are located on the vias, each ground pad having a hole located at the center thereof;

forming a solder mask to cover the patterned trace layer wherein the ground pads, the balls pads and the nodes remain exposed;

providing a chip having an active surface and a corresponding back surface, wherein the back surface of the chip is adhered on the chip region, and a plurality of bonding pads are formed on the active surface;

electrically connecting the bonding pads to the nodes;

performing a molding process encapsulating the chip, the nodes and connecting portions between the bonding pads and the nodes;

placing a plurality of solder balls on the ground pads and the ball pads; and performing a reflow process so that the solder balls on the ground pads are softened and fill the vias and electrically connect with the conductive bumps.

2. The method of claim 1, wherein the thermal dissipating substrate comprises a heat spreader and a ground plate, which is located on the circuit substrate region, and the circuit substrate having an opening exposing the chip region.

3. The method of claim 1, wherein the chip is electrically connected to the ground plate.

4. The method of claim 1, wherein the chip region of the thermal dissipating substrate has a cavity and the chip is adhered on a bottom surface of the cavity.

5. The method of claim 1, wherein the chip is electrically connected to the thermal dissipating substrate.

6. The method of claim 1, wherein a palladium layer is formed on a surface of the circuit substrate region before forming the conductive bumps.

7. The method of claim 1, wherein the insulating layer is made of polyimide, and the patterned trace layer is defined by etching a copper foil layer utilizing photolithography.

8. The method of claim 1, wherein the step of forming the conductive bumps is accomplished by using a wire bonding machine.

9. The method of claim 1, wherein the step of forming the conductive bumps is accomplished by using an electroplating method.

10. The method of claim 9, wherein the conductive bumps are made of a material selected from a group consisting of gold and silver.

11. The method of claim 1, wherein the step of forming the conductive bumps includes a dispensing method.

12. A method of fabricating a CDBGA package, comprising:

providing a thermal dissipating substrate having a chip region at the center thereof and a circuit substrate region located at a periphery of the chip region;

forming a palladium layer on a surface of the circuit substrate region;

after forming the palladium layer, forming a plurality of conductive bumps on the circuit substrate region;

providing a circuit substrate comprising an insulating layer and a patterned trace layer, wherein a plurality of vias are formed on the insulating layer, and correspond to the conductive bumps, the insulating layer is adhered on the circuit substrate region, and a plurality of ground pads, ball pads and nodes are formed on the patterned trace layer, wherein the ground pads are located on the vias, each ground pad has a hole located at the center thereof, the hole corresponds to a via;

forming a solder mask to cover the patterned trace layer and to expose the ground pads, the balls pads and the nodes;

providing a chip having an active surface and a corresponding back surface, wherein the back surface of the chip is adhered on the chip region, and a plurality of bonding pads are formed on the active surface;

electrically connecting the bonding pads to the nodes;

performing a molding process encapsulating the chip, the nodes and connecting portions between the bonding pads and the nodes; and placing a plurality of solder balls on the ground pads and the ball pads, wherein the solder balls located on the ground pads fill the vias and are electrically connected to the conductive bumps.

13. A method of fabricating a CDBGA package, comprising:

providing a thermal dissipating substrate having a chip region at the center thereof and a circuit substrate region located at a periphery of the chip region;

forming a palladium layer on a surface of the circuit substrate region;

forming a plurality of conductive bumps on the circuit substrate region;

providing a circuit substrate comprising an insulating layer and a patterned trace layer, wherein a plurality of vias are formed on the insulating layer, and the conductive bumps are positioned within the vias, wherein the insulating layer is adhered on the circuit substrate region, and a plurality of ground pads, ball pads and nodes are formed on the patterned trace layer, and wherein the ground pads are located on the vias, each ground pad having a hole located at the center thereof;

forming a solder mask to cover the patterned trace layer, wherein the ground pads, the balls pads and the nodes remain exposed;

providing a chip having an active surface and a corresponding back surface, wherein the back surface of the chip is adhered on the chip region, and a plurality of bonding pads are formed on the active surface;

electrically connecting the bonding pads to the nodes;

performing a molding process encapsulating the chip, the nodes and connecting portions between the bonding pads and the nodes;

placing a plurality of solder balls on the ground pads and the ball pads; and performing a reflow process so that the solder balls on the ground pads are soften and fill the vias and electrically connect with the conductive bumps.

* * * * *